(12) United States Patent
Worley et al.

(10) Patent No.: US 7,724,485 B2
(45) Date of Patent: May 25, 2010

(54) N-CHANNEL ESD CLAMP WITH IMPROVED PERFORMANCE

(75) Inventors: Eugene Worley, Irvine, CA (US); Vivek Mohan, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 463 days.

(21) Appl. No.: 11/738,336

(22) Filed: Apr. 20, 2007

(65) Prior Publication Data
US 2008/0049365 A1 Feb. 28, 2008

Related U.S. Application Data

(60) Provisional application No. 60/840,275, filed on Aug. 24, 2006.

(51) Int. Cl.
H02H 9/00 (2006.01)
(52) U.S. Cl. ..................................... 361/56
(58) Field of Classification Search ................ 361/56
See application file for complete search history.

(56) References Cited

U.S. PATENT DOCUMENTS

| | | | |
|---|---|---|---|
| 5,596,474 A * | 1/1997 | Wada et al. | 361/111 |
| 5,631,793 A | 5/1997 | Ker et al. | |
| 6,075,686 A * | 6/2000 | Ker | 361/56 |
| 6,249,410 B1 | 6/2001 | Ker et al. | |
| 6,351,363 B1 * | 2/2002 | Wang | 361/111 |
| 6,552,886 B1 * | 4/2003 | Wu et al. | 361/56 |
| 6,624,992 B1 | 9/2003 | Aparin | |
| 7,256,975 B2 | 8/2007 | Wu et al. | |
| 7,405,915 B2 * | 7/2008 | Choi | 361/56 |
| 2004/0164354 A1 * | 8/2004 | Mergens et al. | 257/355 |

(Continued)

FOREIGN PATENT DOCUMENTS

WO WO 2006072292 A1 * 7/2006

OTHER PUBLICATIONS

International Search Report—PCT/US2007/076763, International Search Authority—European Patent Office—May 21, 2008.

(Continued)

*Primary Examiner*—Stephen W Jackson
*Assistant Examiner*—Ann T Hoang
(74) *Attorney, Agent, or Firm*—Eugene Worley; Jiayu Xu

(57) ABSTRACT

An electrostatic discharge (ESD) protection circuit uses two N-channel field effect transistors (NFETs) to conduct ESD current from a first to a second supply node. During the ESD event, an ESD detection circuit couples the gates of both NFETs to the first supply node through separate conductive paths. In one novel aspect, an RC trigger circuit includes a capacitance that is charged through a resistance. The resistance involves a P-channel transistor whose gate is coupled to the gate of the second NFET. During a normal power-up condition, the P-channel transistor is conductive, thereby preventing the RC trigger from triggering if the supply voltage VDD were to rise rapidly. In another novel aspect, a novel level-shifting inverter drives the second NFET. The level-shifting inverter uses a pull down resistor to avoid snap-back and also isolates the gate of the second NFET from a capacitively loaded third supply node.

16 Claims, 6 Drawing Sheets

U.S. PATENT DOCUMENTS

2007/0058306 A1* 3/2007 Poulton ................ 361/56
2008/0043389 A1* 2/2008 Fehle et al. ............ 361/56

OTHER PUBLICATIONS

Written Opinion—PCT/US2007/076763, International Search Authority—European Patent Office—May 21, 2008.

Stacked PMOS Clamps For High Voltage Power Supply Protection. Maloney T.J.; Kan, W.; Electrical Overstress/Electrostatic Discharge Symposium Proceedings, Sep. 28-30, 1999, pp. 70-77.

Methods for Designing Low-Leakage Power Supply Clamps. Maloney, TJ. ;Poon S. S.; Clark L.T., Electrical Overstress/Electrostatic Discharge Symposium, Las Vegas, NV, Sep. 21-25, 2003.

* cited by examiner

20 MILLISECOND POWER-UP SEQUENCE WITHOUT PSEQ

20 MILLISECOND POWER-UP SEQUENCE WITH PSEQ

N-CHANNEL ESD CLAMP WITH IMPROVED PERFORMANCE

The present Application for Patent claims priority to Provisional Application No. 60/840,275 entitled "Improved Cascoded RC Triggered ESD Clamp" filed Aug. 24, 2006, and assigned to the assignee hereof and hereby expressly incorporated by reference herein.

BACKGROUND INFORMATION

1. Technical Field

The disclosed embodiments relate to ESD protection circuits.

2. Background Information

Integrated circuits can be damaged by high voltage spikes produced by electrostatic discharge (ESD). High static charges can develop on the human body. Consider a situation in which a packaged integrated circuit is free and is not coupled to a printed circuit. Power and ground conductors within the integrated circuit may be resting at a first potential. If a person were charged with a static charge, and then were to touch a terminal of the integrated circuit, the high static voltage charge on body of the person might be discharged quickly through the terminal and into the integrated circuit until the integrated circuit and the human body equalize at a common potential. Such an electrostatic discharge event would momentarily introduce high voltages and high currents into the integrated circuit that may damage the integrated circuit. In one example, the gate dielectric material of a small logic transistor in the integrated circuit is thin and breaks down when a high voltage is momentarily present between its gate electrode and the underlying semiconductor material. During the ESD event, the gate dielectric breaks down and is permanently damaged. When the integrated circuit is later incorporated into a usable product, the product may be defective or inoperable due to the damage done to the integrated circuit during handling.

To prevent this situation, circuits called electrostatic discharge (ESD) protection devices are commonly incorporated into integrated circuits. An ESD protection circuit has circuitry that is able to shunt the momentary high currents of an ESD discharge event while dropping a low, non-destructive voltage. One type of ESD protection circuit is commonly referred to as an ESD "clamp." If the voltage between a voltage supply terminal and a ground terminal of the integrated circuit starts to increase rapidly as in an ESD event, then the ESD protection device becomes conductive and clamps one terminal to the other (or clamps one internal supply voltage bus to another). The clamping is such that the charge of the high voltage ESD event on one of the terminals is discharged through the ESD protection device and to the other terminal. The ESD event is only of a short duration, so after the ESD event the ESD protection device is no longer conductive. There are situations in which circuitry must be operated at a voltage higher than the rating of the semiconductor field effect transistors (FETs) used in the circuit. In such a case, a technique called "cascading" is used. In this technique, FETs of like polarity are placed in series to allow the circuit to operate above the voltage rating of the individual FETs. Such circuits require a bias voltage level between the positive supply terminal and the negative supply terminal.

FIG. 1 (Prior Art) is a circuit diagram of one conventional cascoded ESD protection circuit. Supply voltage conductor 1 is coupled to a first terminal and ground conductor 2 is coupled to a second terminal, and an intermediate supply 9 or cascode bias voltage is coupled to a third terminal. Assume that all nodes of the circuit are initially at the same potential. If the voltage on conductor 1 increases rapidly with respect to ground potential on conductor 2, then the large N-channel FETs 3 and 4 are made conductive to conduct possible ESD current from conductor 1 to conductor 2. The circuit involves two RC circuits. P-channel transistor 5 functions as a resistor and P-channel transistor 6 functions as a capacitor. P-channel transistors 7 and 8 are coupled together in similar fashion. Consider the RC circuit involving transistors 5 and 6. Initially, the capacitance of transistor 6 is discharged and there is no voltage drop across the capacitance of transistor 6. Node 10 is therefore at a digital low with respect to the supply voltages on leads 11 and 12 of inverter 13. When the voltage between conductors 1 and 9 increases rapidly, the capacitance of transistor 6 is charged relatively slowly through the resistance of transistor 5. As a result, a digital low is present on the input of inverter 13. Inverter 13 outputs a digital high, which causes the gate of large N-channel transistor 3 to be coupled to conductor 1. Large N-channel transistor 3 is made conductive. The lower portion of the circuit of FIG. 1 works in an identical fashion to the upper portion of the circuit. Accordingly, both large N-channel transistors 3 and 4 turn on quickly during an ESD condition when the voltage between conductors 1 and 2 is detected to rise rapidly. Transistors 3 and 4 discharge the static ESD charge, and prevent the voltage between conductors 1 and 2 from reaching high levels that would damage other sensitive circuitry within the integrated circuit.

After a short time, the capacitances of transistors 6 and 8 charge to the point that the voltages on nodes 10 and 14 reach the switching voltages of inverters 13 and 15. The inverters 13 and 15 then switch to output digital logic low values that in turn cause transistors 3 and 4 to be nonconductive. Once the large N-channel transistors 3 and 4 are nonconductive, then a voltage supply supplying VDD can be coupled to conductors 1 and 2 in a normal power-up condition. In a normal power-up condition, the voltage between conductors 1 and 2 does not rise quickly as in an ESD event. The voltages between conductors 1 and 9 and between conductors 9 and 2 increase slowly such that the capacitors of transistors 6 and 8 are always adequately charged and such that the voltage on nodes 10 and 14 remain above the switching voltages of inverters 13 and 15. Inverters 13 and 15 therefore always output digital logic low values. The transistors 3 and 4 therefore remain nonconductive. The voltage between conductors 1 and 2 can be raised in this fashion until the voltage between the conductors 1 and 2 is at the supply voltage VDD level. The ESD protection circuit does not conduct current from conductor 1 to conductor 2 during a normal power-up condition.

There are two common models used to test the adequacy of ESD protection circuits: the Human Body Mode (HBM) and the Charge Device Model (CDM). In the CDM model, the ESD pulses are of high current magnitudes but are of shorter duration than the ESD pulses in the HMB model. Under CDM testing, large N-channel transistors used to conduct ESD current in ESD clamps were noticed to fail. Ballasts were therefore provided and the voltage at which the ESD protection failed was successfully increased. It was, however, recognized that providing the ballasts increased the amount of integrated circuit area consumed by the ESD protection circuits. A P-channel transistor of similar construction, although it had a lower carrier mobility and therefore was made larger to conduct the same amount of ESD current as an N-channel transistor, was not seen to fail in the ESD protection circuit application. The amount of integrated circuit area consumed by the P-channel transistor was sometimes less than the amount of integrated circuit area consumed by a smaller N-channel transistor and its associated ballast. Accordingly, ESD protection circuits came to use P-channel transistors for the large ESD current carrying transistors.

FIG. 2 (Prior Art) is a diagram of an ESD protection circuit employing P-channel transistors P1 and P2 for the large ESD current carrying transistors. During a rapid rise of the voltage between conductor 16 and ground conductor 17, the RC circuit 18 initially provides a digital logic low onto the input lead 19 of inverter 20 with respect to the supply voltages on inverter 20. Inverter 20 therefore outputs a digital logic high onto the input lead 23 of inverter 21, which in turn couples the gate of P1 to the low potential on node 22. Transistor P1 is therefore made conductive. The low potential on node 22 is directly coupled to the gate of transistor P2, so transistor P2 is also conductive. Node 23 is coupled to conductor 16 by inverter 20, so node 23 has a higher potential than does node 22. The voltage on node 22 is below the switching threshold of inverter 23. Inverter 24 therefore outputs a digital high voltage (the voltage on node 23) onto the gate of transistor 25, thereby making transistor 25 conductive and keeping the voltage on node 22 coupled to ground potential. The ESD current is conducted from conductor 16, through transistors P1 and P2, and to ground conductor 17.

After the passing of the ESD event, the voltage on node 19 increases with respect to the voltage on conductor 22 to the point that the switching threshold of inverter 20 is reached. Inverter 20 switches, inverter 21 switches, and the gate of transistor P1 is coupled to conductor 16 by inverter 21. Transistor P1 is then turned off. At this time, node 23 is coupled to node 22 by the pulldown transistor in inverter 20. The voltage on the input lead of inverter 24 is no longer below the switching point of inverter 24. Inverter 24 therefore switches and couples the gate of transistor 25 to ground conductor 17, thereby turning transistor 25 off. Because node 22 is no longer coupled to ground conductor 17, the voltage on node 22 rises and turns transistor P2 off. Accordingly, after the ESD event both large P-channel transistors P1 and P2 are nonconductive. Under normal operating conditions with a voltage applied to supply conductor 16, an intermediate voltage to conductor 22, and ground to ground conductor 17, the gate of transistor P1 is held to its source potential thereby biasing transistor P1 off. The gate of transistor P2 is held at the potential of conductor 22, thereby lowering the drain-to-source potential of transistor P1 to a safe level.

SUMMARY

An electrostatic discharge (ESD) protection circuit uses a stacked pair of large series-connected Field Effect Transistors (FETs) to conduct ESD current from a first supply node to a second supply node in an integrated circuit. The ESD protection circuit includes an ESD detection circuit. During an ESD event, an RC trigger circuit within an ESD detection circuit triggers, thereby causing the ESD detection circuit to make both the first FET and the second FET conductive. ESD current can therefore be conducted from the first supply node, through the first FET, through the second FET, and to the second supply node. After an amount of time, the RC trigger circuit times out. The time out causes the ESD detection circuit to turn off the FETs.

During a normal power-up sequence, a cascode supply voltage V2 (for example, 1.8 volts) is applied onto a third supply node of the ESD protection circuit. The voltage on the third supply node is ramped up from zero volts to the supply voltage V2. Then, a supply voltage VDD (for example, 3.0 volts) is applied onto the first supply node of the ESD protection circuit. The voltage on the first supply node is ramped up from zero volts to the voltage VDD. The ramp times in the normal power-up sequence are adequately long that the RC trigger circuit does not trigger. The stacked series-connected FETs of the ESD protection circuit are therefore not made conductive. In one example, the RC trigger circuit does not trigger if the voltage VDD ramps from zero volts to 3.0 volts in 20 microseconds or more.

In one novel aspect, the stacked series-connected FETS are N-channel FETs (NFETs). During an ESD event, the ESD detection circuit couples the gates of both of these NFETs to the first supply node. The NFETs are coupled to the first supply node by different and separate conductive paths. The first and second FETs, rather than being P-channel FETS, are N-channel FETs. Each NFET is completely encircled by its own substrate tie ring. The substrate tie ring couples the body of the NFET to a ground potential through numerous body contacts. Each body contact couples a P+ diffusion into the body with the overlying tie ring. The contacts are located in a ring at a distance from the transistor channel. During an ESD event, the body tie and tie ring structure cause a slight shifting of the threshold voltage of the NFET which in turn allows the NFET to draw more current without failing under the high voltage conduction situation.

In a second novel aspect, the RC trigger circuit includes a capacitance that is charged through a resistance. Between the resistance and the capacitance is a node called the trigger node. The resistance involves a P-channel transistor whose gate is coupled to the gate of the second NFET. During an ESD event, the gate of the second NFET is coupled to the first supply node by the ESD detection circuit as described above. Accordingly, the P-channel transistor is biased off and is not conductive during an ESD event. The P-channel transistor does not affect the timing of the RC trigger circuit during an ESD event. In a normal power-up sequence, however, the gate of the second NFET is coupled to the second supply node. The relatively low voltage on the gate of the second NFET causes the P-channel transistor of the resistance of the RC trigger circuit to be conductive. The P-channel transistor being conductive couples the trigger node to the third supply node, and prevents the RC trigger from triggering under a condition of a rapid rise in the supply voltage VDD on the first supply node.

In a third novel aspect, the ESD detection circuit includes a level-shifting inverter. The level-shifting inverter includes two series-connect P-channel transistors and a pulldown resistor. If both of the P-channel transistors are made to be conductive, then the P-channel transistors pull an output node of the level-shifting inverter up to a high potential on the first supply node. The output node is coupled to the gate of the second NFET. If, on the other hand, one of the P-channel transistors is not conductive, then the pulldown resistor pulls the output node down to the low potential on the second supply node. The level-shifting inverter is used to communicate the trigger signal from the RC trigger circuit to the gate of the second NFET so that the second NFET is turned on during an ESD event as so that the NFET is turned off by a time out of the RC trigger circuit. Advantageously, the resistor is used to pull down the output node rather than an N-channel transistor because an N-channel transistor could be susceptible to snap-back. If an N-channel transistor were to snap-back, then the gate drive to the second NFET could be reduced and/or the N-channel transistor could become damaged. Another advantage of the level-shifting inverter is that the third supply node onto which the supply voltage V2 is received is not directly coupled to the gate of the second NFET. The third supply node may be capacitively loaded due to its being connected to other circuitry on the integrated circuit and due to its being connected to a supply terminal. The decoupling of the gate of the second NFET from the third supply node allows the voltage on the gate of the second NFET to be changed rapidly without being slowed down by the capacitive load on the third supply node.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 3:
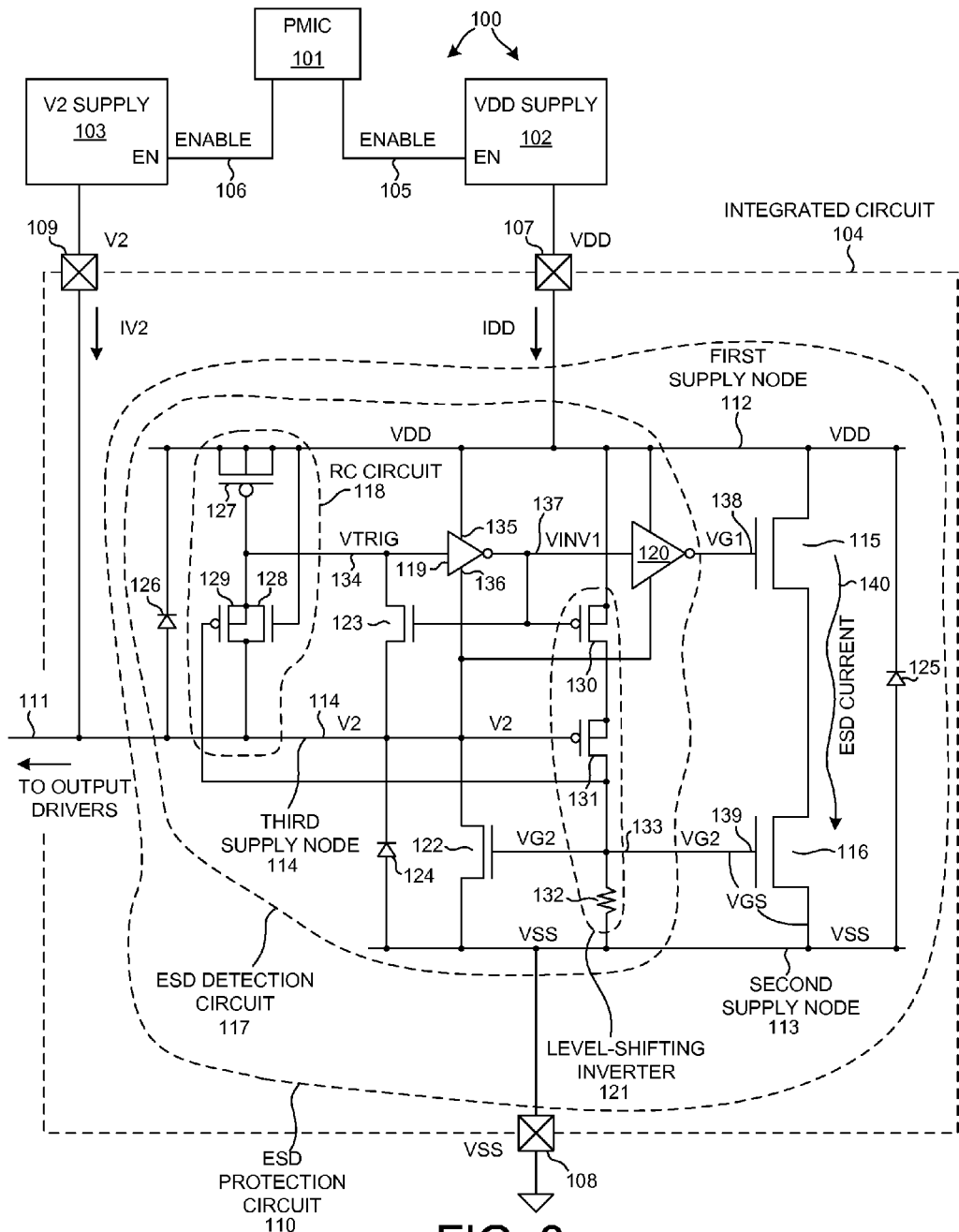
FIG. 3 is a diagram of a system 100 in accordance with one novel aspect. The system 100 includes a novel ESD protection circuit 110.

FIG. 3 is a diagram of a system 100 in accordance with one novel aspect. System 100 includes a power management integrated circuit (PMIC) 101, a first external voltage supply source 102, a second external voltage supply source 103, and an integrated circuit 104. The PMIC 101 controls the sequencing of how the supply voltages VDD and V2 are supplied to integrated circuit 104 during a normal power-up condition. PMIC 101 controls the sequencing by enabling the external voltage supply sources 102 and 103 through enable lines 105 and 106. If, for example, VDD voltage supply source 102 is enabled, then VDD voltage supply source 102 supplies supply voltage VDD onto terminal 107 of integrated circuit 104. It is understood that the voltage VDD is a voltage between terminals 107 and 108 and that the external voltage supply source 102 is also connected to terminal 108 by connections not shown. Similarly, if V2 voltage supply source 103 is enabled, then V2 voltage supply source 103 supplies supply voltage V2 onto terminal 109 of integrated circuit 104. In this example, PMIC 101 controls the order and ramp rates in which the power supply voltages VDD (for example, 3.0 volts) and V2 (for example, 1.80 volts) are supplied to integrated circuit 104.

Integrated circuit 104 includes the three supply terminals 107-109, an electrostatic discharge (ESD) protection circuit 110, and other circuitry (not shown). Integrated circuit 104 is fabricated in a 45 nanometer CMOS process or another suitable CMOS process. The other circuitry includes circuitry that is to be protected by the ESD protection circuit. In the illustrated example, the integrated circuit 104 includes output drivers (not shown) for driving signals out of integrated circuit 104. These output drivers receive the supply voltage V2 from another source and are therefore coupled to terminal 109. Voltage V2 is an intermediate cascode voltage and is used to allow MOSFETs to operate in a safe operating region even though the supply voltage VDD is higher than the safe operating voltage of the MOSFETs. Similarly, ESD protection circuit 110 receives the supply voltage V2 from another source. Conductor 111 is a conductor through which terminal 109 is coupled to the output drivers and to ESD protection circuit 110.

ESD protection circuit 110 includes a first supply node 112, a second supply node 113, a third supply node 114, a first large N-channel field effect transistor (NFET) 115, a second large NFET 116, and an ESD detection circuit 117. The first and second NFETs are sometimes referred to as "bigFETs". ESD detection circuit 117 includes an RC circuit 118, two CMOS inverters 119 and 120, a level-shifting inverter 121, a third NFET 122, a fourth NFET 123, and three diodes 124-126. RC circuit 118 includes a P-channel field effect transistor 127 (200/6 microns) that is connected to function as a capacitor. RC circuit 118 also includes an N-channel field effect transistor 128 (30/0.6 microns) and a P-channel field effect transistor 129 (10/0.6 microns) that are coupled in parallel. These transistors 128 and 129 function as a resistance through which current flows to charge the capacitance of transistor 127. RC circuit 118 together with CMOS inverter 135 are referred to here as an RC trigger circuit. CMOS inverter includes a 10/0.2 micron P-channel pullup FET and a 40/0.2 micron N-channel pulldown FET.

Level-shifting inverter 121 includes two P-channel transistors 130 and 131 (240/0.2 microns) and a 5 k ohm pulldown resistor 132. Resistor 132 may, for example, be a polysilicon resistor or a diffusion resistor. If both of transistors 130 and 131 are controlled to be conductive, then transistors 130 and 131 pull the voltage on output node 133 up to the voltage on first supply node 112. If, on the other hand, either of transistors 130 or 131 is controlled to be nonconductive, then current flow through resistor 132 pulls the voltage on output node 133 down to the voltage on second supply node 113. The pull down component of level-shifting inverter 121 is not an N-channel transistor, but rather is a resistor 132. If an N-channel transistor were used, then there would be a possibility that the transistor could snap-back, and become damaged and/or reduce the gate drive of NFET 116. Using resistor 132 to pull down the output node 133 within the level-shifting inverter eliminates the possibility of snap-back.

Figure 1:
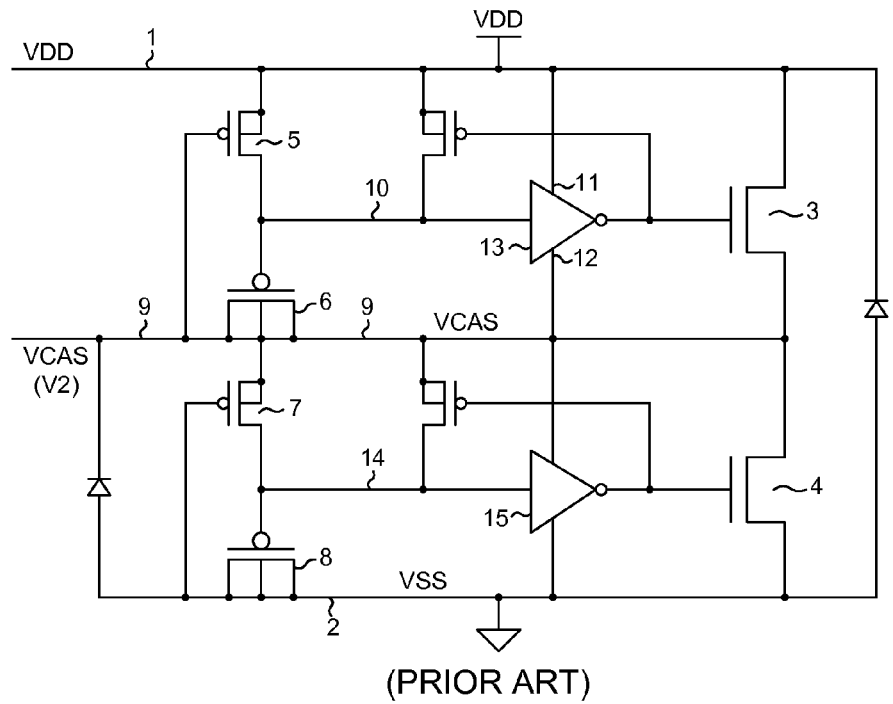
FIG. 1 (Prior Art) is a circuit diagram of a first type of conventional ESD protection circuit.
Figure 2:
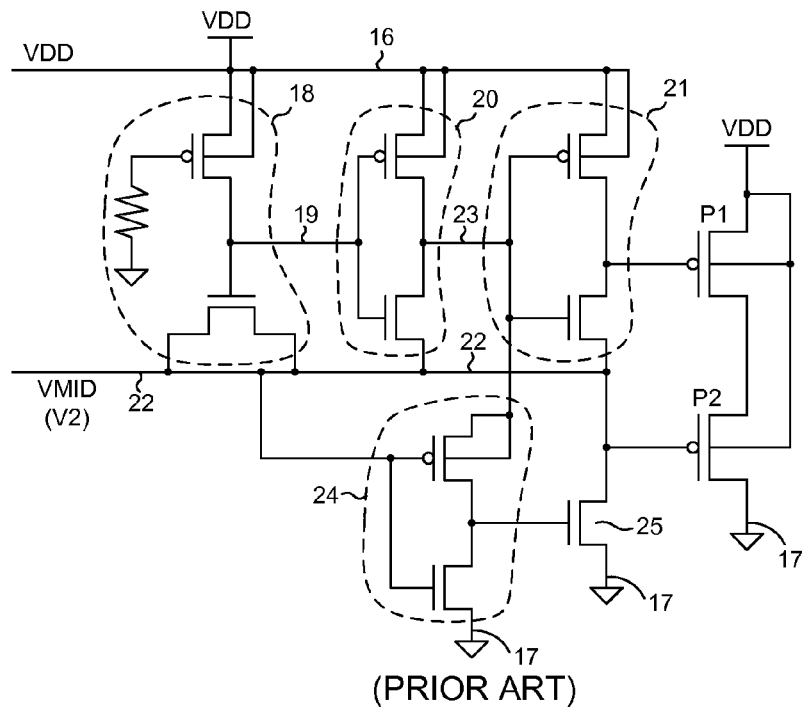
FIG. 2 (Prior Art) is a circuit diagram of a second type of conventional ESD protection circuit.
Figure 3A:
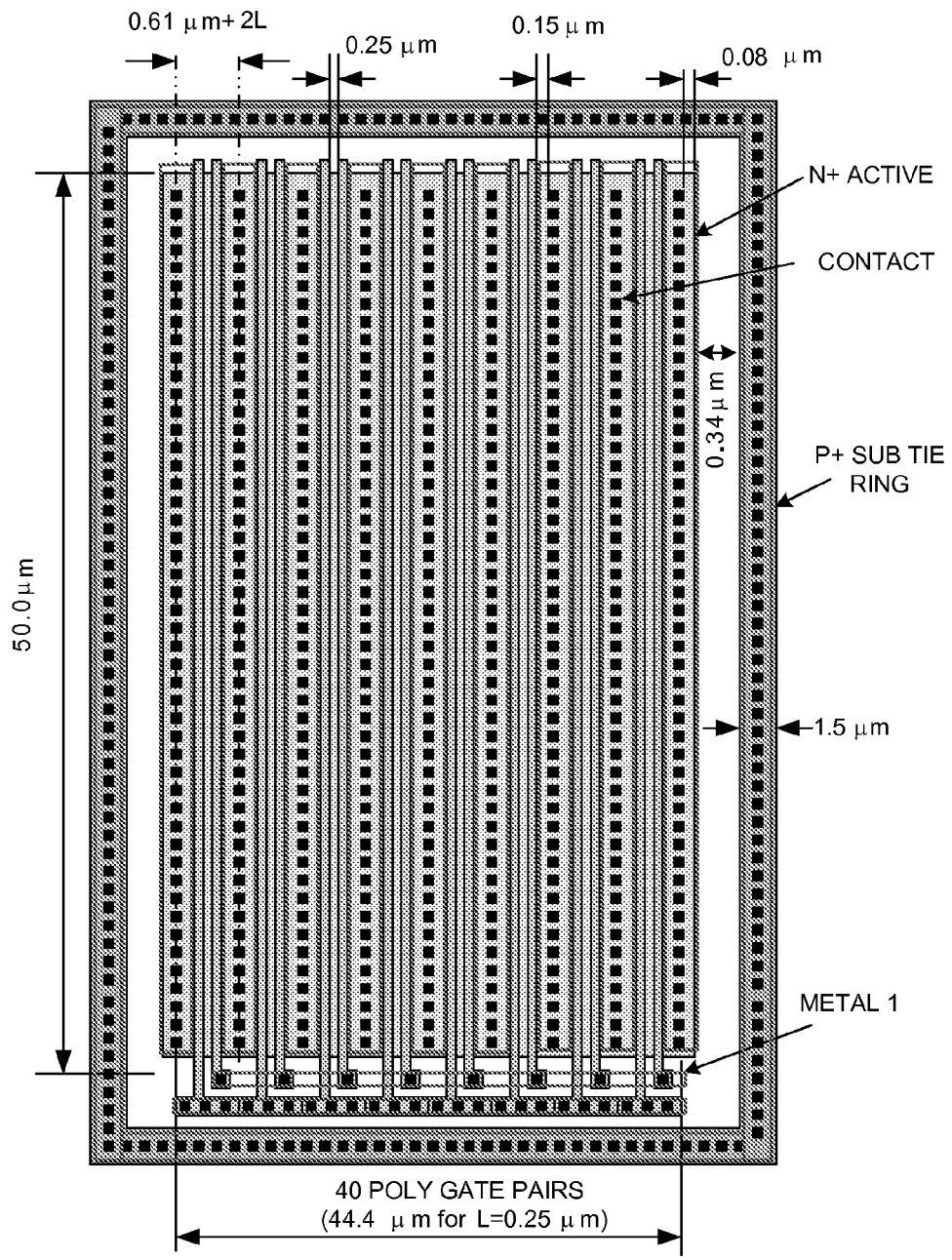
FIG. 3A is a top-down layout diagram of one of NFETs 115 and 116.

FIG. 3A is a layout diagram of one of NFETs 115 or 116. NFETs 115 and 116 are 2000/L micron short-channel thin oxide field effect transistors having what are referred to as "loose body ties". To optimize layout area, NFETs 115 and 116 are laid out with their polysilicon gates next to each other and with a common substrate tie ring encircling the two NFETs 115 and 116. The substrate tie ring couples the body of the NFETs to a ground potential on second supply node 113. Each contact couples a P+ diffusion with the overlying metal tie ring. The P+ diffusion tie ring is located in a ring at a distance from the transistor channel. When the NFET goes into a high voltage conduction mode during an ESD event, there is impact ionization current due to the high voltage pulse. The loose body ties and tie ring structures cause forward biasing of the body source junction that in turn cause conduction of the parasitic NPN bipolar transistor associated with the drain, body, and source regions. This allows higher conduction without failure. More precisely, the two NFETs 115 and 116 can conduct in the high drain impact ionization region without failure. Thus, no ballasting is required making the use of NFETs more area efficient than PFETs as in the case of the prior art of FIG. 2.

Consider a situation in which integrated circuit 104 is unpowered and discharged, and is then subjected to a Human Body Model (HBM) ESD event. When integrated circuit 104 is unpowered and discharged, the first, second and third supply nodes 112-114 are all considered to be resting at the same potential. No current is flowing within ESD protection circuit 110 and all the nodes in the circuit are considered to be at ground potential. The capacitance of transistor 127 is discharged, and there is no voltage across the capacitance.

To perform the HBM test and to create a simulated ESD event, an external 100 picofarad HBM capacitor (not shown) is charged to 2000 volts, and is discharged into terminal 107 through a 1.5 k ohm external resistor (not shown). If ESD protection circuit 110 were not provided, then a large voltage spike would be imposed between the first and second supply nodes 112 and 113 and damage to the other circuitry of integrated circuit 104 could occur. In the circuit of FIG. 3, however, the voltage on first supply node 112 (with respect to the potential on second supply node 113) increases rapidly. Large NFETs 115 and 116 are nonconductive. Because capacitor 127 is discharged, the trigger voltage VTRIG on trigger node 134 is at the voltage on first supply node 112. The voltage on third supply node 114 remains at ground potential. As the voltage between the first and third supply nodes 112 and 114 increases, the voltages supplied onto supply leads 135 and 136 of inverter 119 increase. Inverter 119 begins to function as a logic inverter. Because the voltage on the input lead of inverter 119 is a digital high (approximately the voltage on first supply node 112 due to capacitor 127 being discharged), inverter 119 outputs a digital logic low and attempts to pull the timing signal voltage VINVI on node 137 low to the potential on third supply node 114. Inverter 120 receives the low timing signal voltage VINVI on node 137 and outputs a high signal VG1 onto the gate 138 of NFET 115. Inverter 120 outputs the high signal VG1 when a P-channel pullup transistor within inverter 120 couples the output lead of the inverter to first supply node 112. As a result of the voltage of signal VG1, the gate-to-source voltage of NFET 138 exceeds its threshold voltage and NFET 115 is made conductive.

During this initial period of the ESD event, the voltage on third supply node 114 is at ground potential and at the same potential as second supply node 113. Transistor 131 is therefore conductive. The timing signal voltage VINVI is higher (approximately the voltage on first supply node 112) as described above, so transistor 130 is made conductive. Because both transistors 130 and 131 are conductive, the output node 133 of level-shifting inverter 121 is coupled to first supply node 112. The gate 139 of second NFET 116 is therefore driven with the high voltage on node 112, and second NFET is made conductive. Because both the first and second NFETS 115 and 116 are conductive, a conductive path is established from first supply node 112, through first NFET 115, through second NFET 116, and to second supply node 113. An ESD current 140 flows, thereby clamping the voltage between the two nodes 112 and 113 to a voltage that is not so high that other circuitry on integrated circuit 104 will be harmed. In the illustrated example, the voltage between nodes 112 and 113 does not exceed 2.1 volts. In contrast to the conventional clamp of FIG. 2, the gate of first NFET 115 is coupled to first supply node 112 by a first conductive path through the P-channel pullup transistor (200/0.2 microns) within inverter 120 and the gate of the second NFET 116 is coupled to first supply node 112 by a second and entirely separate conductive path through P-channel transistors 131 and 130.

During this portion of the ESD event, the capacitance of transistor 127 charges through the resistance of the parallel-connected transistors 128 and 129. The voltage on trigger node 134 therefore decreases with respect to the voltage on first supply node 112. When the voltage VTRIG on trigger node 134 reaches the switching voltage of inverter 119, inverter 119 switches. The RC circuit is said to have "timed out". The timing signal voltage VINVI goes high (node 137 is coupled to first supply node 112 by inverter 119). Transistor 123 is provided to add an amount of hysteresis to the switching characteristic of inverter 119. Because the timing signal voltage VINVI goes high, inverter 120 also switches and the voltage VG1 goes low (the voltage on gate 138 is coupled to the voltage on third supply node 114 through an N-channel pulldown transistor within inverter 120). Because the voltage on third supply node 114 is at ground potential at this time, first NFET 115 is made nonconductive. The digital high voltage on node 137 also causes P-channel transistor 130 to be nonconductive. As a result, node 133 is no longer coupled to first supply node 112 through transistors 130 and 131. Node 133 is pulled down to the voltage on second supply node 113 by resistor 132. This low voltage on gate 139 of second NFET 116 causes second NFET 116 to be made nonconductive. Because the first and second NFETs 115 and 116 are nonconductive, the conductive current path between first supply node 112 and second supply node 113 no longer exists.

The ESD high voltage pulse is of a very short duration and is typically shorter than one microsecond. In fact, the RC time constant of an HBM discharge is 150 nanoseconds. The ESD protection circuit therefore only needs to create the conductive current path during the short time that the ESD voltage could be present on first supply node 112. The RC time constant of RC circuit 118 is made adequately large so that the conductive ESD current path remains for a period of time larger than the duration of the short ESD pulse. In the specific example illustrated in FIG. 3, this timeout period of the RC circuit is approximately 2 microseconds.

Once the ESD current path no longer exists, the voltages on the first and third supply nodes 112 and 114 can be raised in a normal and ordinary power-up sequence so that the terminals 107-109 are provided with their proper voltages for operation of integrated circuit 104. In one example, a proper power-up sequence involves raising the supply voltage V2 on terminal 109 from zero volts to 1.8 volts over a period of ten milliseconds or more, and then once the supply voltage V2 has reached 1.8 volts increasing the supply voltage VDD on terminal 107 from zero volts to 3.0 volts over the next ten millisecond period. There is negligible current leakage through the ESD protection circuit 110.

If, rather than a rapid voltage rise condition of the ESD event described above, the voltages on the first and third supply nodes 112 and 114 were increased more slowly in a normal power-up sequence, then the ESD protection circuit 110 is not to form the conductive path between nodes 112 and 113. The first and second NFETs 115 and 116 are to remain nonconductive if the voltage between the first and second supply nodes increases from zero volts to 3.0 volts in 20 microseconds or more.

Operation of the ESD protection circuit 110 under the normal power-up sequence is as follows. When the voltage between the first and second supply nodes 112 and 113 increases slowly, the capacitance of transistor 127 charges fast enough that the voltage on trigger node 134 remains adequately close to the voltage on third supply node 114 that inverter 119 continuously receives a digital logic low on its input lead. Inverter 119 therefore continuously outputs a digital logic high (continuously couples node 137 to first supply node 112). Inverter 120 therefore continuously couples the gate 138 of first NFET 115 to third supply node 114 and first NFET 115 is never made conductive. Furthermore, because the voltage on node 137 remains at a digital logic high, P-channel transistor 130 remains nonconductive. The voltage on node 133 is therefore pulled down by resistor 132 and remains at the low potential of second supply node 113. The low potential on gate 139 of second NFET 116 keeps second NFET 116 nonconductive. Accordingly, during a normal power-up sequence when the voltage on first supply node 112 rises relatively slowly, the first and second NFETS 115 and 116 are never made conductive and the ESD protection circuit 110 does not perform its clamping function.

Transistor 122 (200/0.2 microns) is provided to keep the voltage on third supply node 114 low at ground potential during an ESD event. There may be a non-trivial amount of capacitance on third supply node 114. This may, for example, be due to the fact that node 114 is coupled to other circuitry (for example, output drivers) on integrated circuit 104 and to external power supply 103. If there is significant capacitance between node 114 and node 112, and if a rapid voltage rise of an ESD event were present on node 112, then capacitive coupling between nodes 112 and 114 could cause the voltage on node 114 to rise. This is undesirable because the voltage on node 114 is to remain adequately low to keep P-channel transistor 131 conductive. If the conductivity of P-channel transistor were to be decreased, then the voltage on node 133 and the gate 139 of second NFET 116 might decrease to the point that second NFET 116 begins to constrict the ESD current path. Second NFET 116 is, however, to be as conductive as possible during the ESD event so that it can conduct the ESD current. Accordingly, N-channel transistor 122 is provided. When the voltage on node 133 is adequately high, N-channel transistor 122 is conductive and couples third supply node 114 to the ground potential on second supply node 113. This keeps the capacitance on third supply node 114 discharged to the voltage on second supply node 113. A rapid increase in the voltage on first supply node 112 does not therefore result in a rise in the voltage on third supply node 114. In one advantageous aspect, third supply node 114 and its associated conductor 111 on integrated circuit 104 is not connected directly to gate 139 of NFET 116. By decoupling the third supply node 114 from the gate of NFET 116, the switching of NFET 116 is not slowed by the potentially large capacitances of conductor 111 that extends to many places (for example, to output drivers and to terminal 109) on integrated circuit 104.

Figure 4:
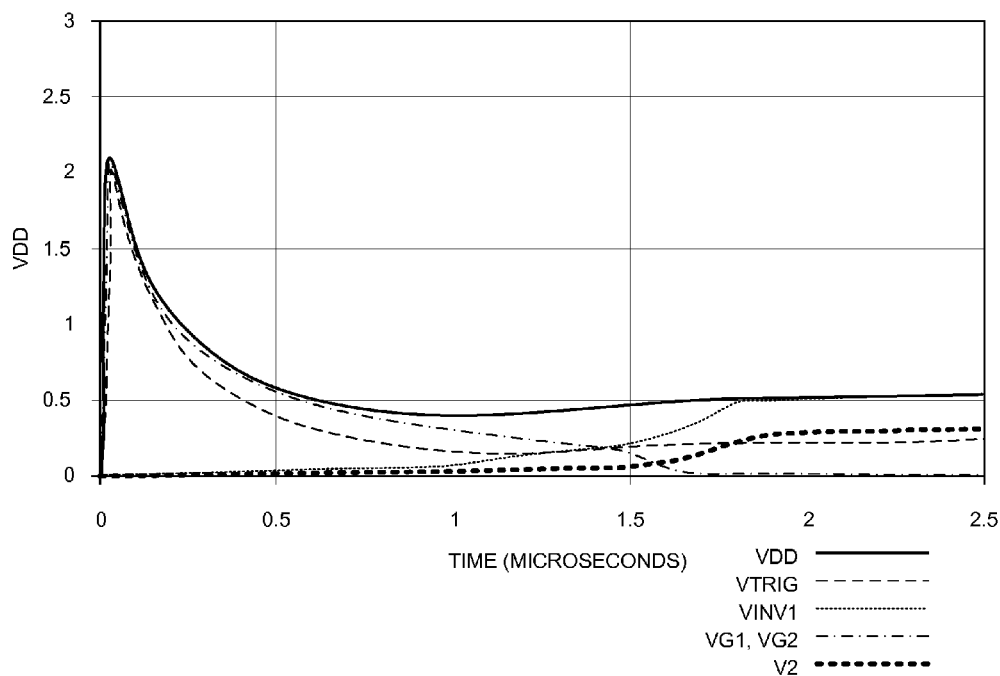
FIG. 4 is a waveform diagram of node voltages within the ESD protection circuit 110 of FIG. 3.

FIG. 4 is a waveform diagram that shows the waveforms of nodal voltages within ESD protection circuit 110 during the above-described HBM ESD event. Note that the voltage VDD is clamped to be less than approximately 2.1 volts.

Figure 5:
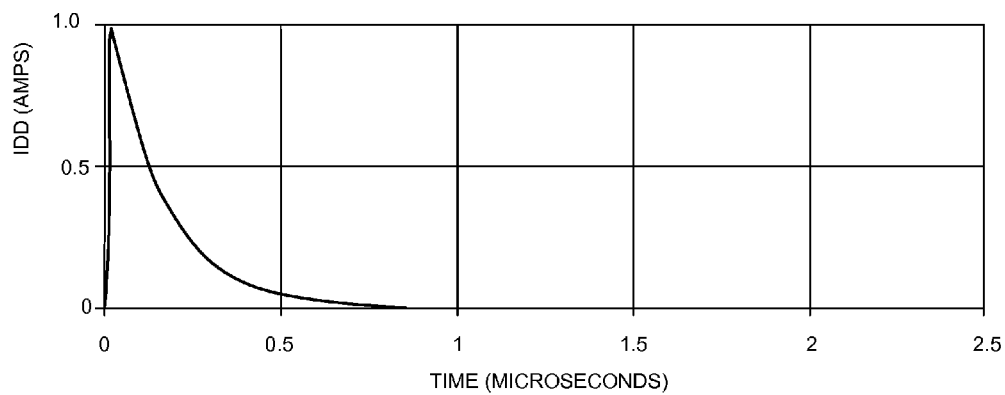
FIG. 5 is a waveform diagram of current IDD flowing into the ESD protection circuit 110 of FIG. 3.

FIG. 5 is a waveform diagram of the current IDD flowing from terminal 107 into ESD protection circuit 110 in the operational example of FIG. 4.

Figure 6:
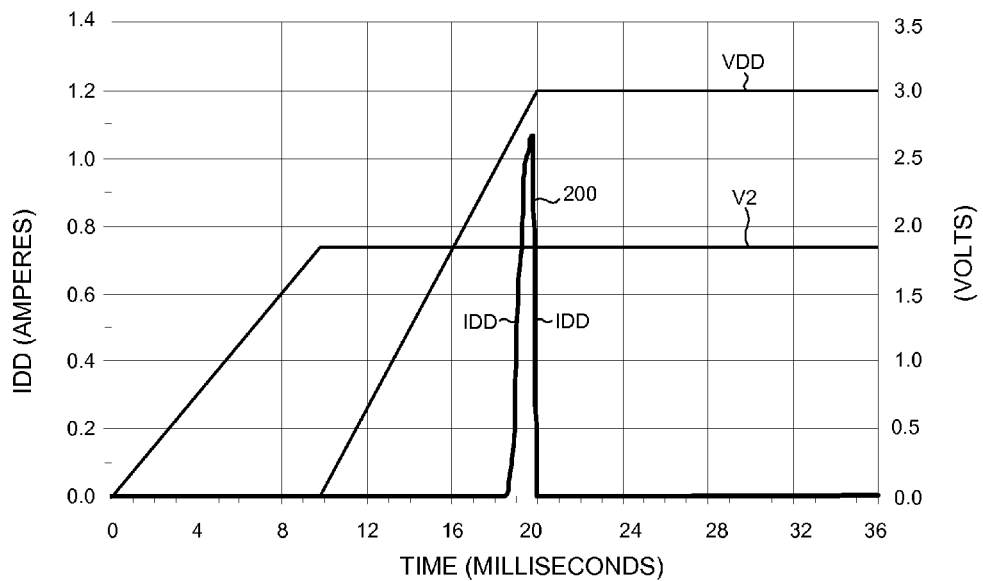
FIG. 6 is a diagram showing a spike in the current IDD under a normal power-up condition, in a situation in which P-channel transistor 129 of the ESD protection circuit is not provided.

FIG. 6 is a waveform diagram that shows a normal power-up sequence. In a normal power-up sequence, the supply voltage V2 is ramped up from zero to 1.8 volts first, and then the supply voltage VDD is ramped up from zero to 3.0 volts. The ramp up period can be as short as one millisecond, or can be as long as one second or more. In the illustrated example, the power-up sequence takes 20 milliseconds.

FIG. 6 also includes a waveform of the current IDD flowing into the ESD protection circuit 110 in an embodiment in which transistor 129 is not provided. Note that there is a large spike 200 in the IDD waveform. No such large current spike is present if the supply voltages V2 and VDD are ramped up over a time longer than one second. The large current spike 200 occurs because both large NFETs 115 and 116 are on momentarily. Once supply voltage V2 has reached 1.8 volts, the supply voltage VDD is ramped up from zero volts as illustrated. Due to the capacitive coupling of transistor 127, the voltage VTRIG on trigger node 134 increases along with supply voltage VDD, thereby causing a larger voltage between trigger node 134 and third supply node 114 than between trigger node 134 and first supply node 112. As a result, inverter 119 switches and outputs a digital low value, inverter 120 switches and outputs a digital high value, and NFET 115 is turned on. When VINVI node 137 is at a digital low value (node 137 is coupled to third supply node 114 by inverter 119), P-channel transistor 130 is conductive. P-channel transistor 131 is already conductive due to supply voltage V2 having been increased up to 1.8 volts. With both P-channel transistors 130 and 131 conductive, the voltage on node 133 increases and NFET 116 is turned on. With both NFETs 115 and 116 on simultaneously, the large current 200 flows from first supply node 112 to second supply node 113. As indicated by FIG. 6, current spike 200 can have a magnitude of over one ampere. Once supply voltage VDD reaches its 3.0 voltage level, the voltage on first supply node 112 stops rising. Transistor 128 is then able to pull the voltage on node 134 down from the voltage on the first supply node. This causes inverters 135 and 120 to switch, and turns off NFETs 115 and 116. The current spike situation is therefore of only a short duration.

To reduce or eliminate the current spike, P-channel transistor 129 is provided. In an ESD event, P-channel transistor 129 is biased off and does not affect circuit operation. It is biased off because node 133 and the gate of NFET 116 are coupled to first supply node 112 as described above. The high voltage on node 133 prevents transistor 129 from turning on. In the normal power-up sequence of FIG. 6, however, the supply voltage V2 is at 1.8 volts before the voltage on first supply node 112 begins to increase. Voltage V2 is on the gate of P-channel transistor 131, so transistor 131 is off. The voltage on node 133 is therefore pulled down to the potential of second supply node 113 through resistor 132. The gate-to-source voltage of P-channel transistor 129 is above the threshold voltage of P-channel transistor 129. P-channel transistor 129 is therefore turned on in the normal power-up sequence. P-channel transistor 129 reduces the resistance between trigger node 134 and the third supply node 114 so that the capacitance of transistor 127 remains fully charged (charged to the voltage difference between nodes 112 and 114) throughout the time supply voltage VDD rises. VTRIG therefore does not rise with the rise of the voltage on first supply node 112, and inverter 119 always outputs a digital logic high. NFETs 115 and 116 therefore are not made conductive, and there is no large current spike through NFETs 115 and 116.

Figure 7:
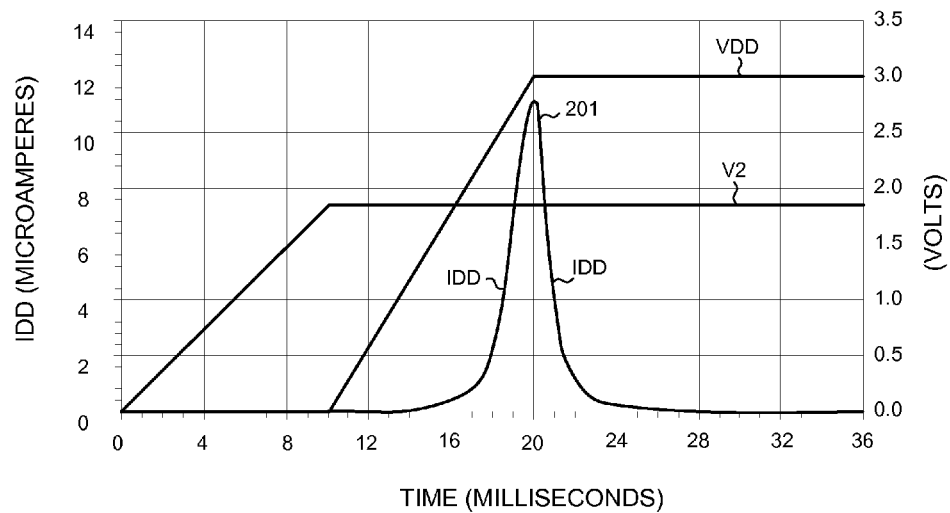
FIG. 7 is a diagram showing the reduced magnitude of the spike of current IDD under a normal power-up condition, in a situation in which P-channel transistor 129 of the ESD protection circuit is provided.

FIG. 7 is a waveform diagram that shows a waveform of the current IDD flowing into the ESD protection circuit 110 when transistor 129 is provided and when the supply voltages are applied in the normal power-up sequence of FIG. 7. The peak magnitude of the spike 201 in current IDD is reduced to less than 11 microamperes. This IDD current is largely due to the charging current that charges transistor 127.

Figure 8:
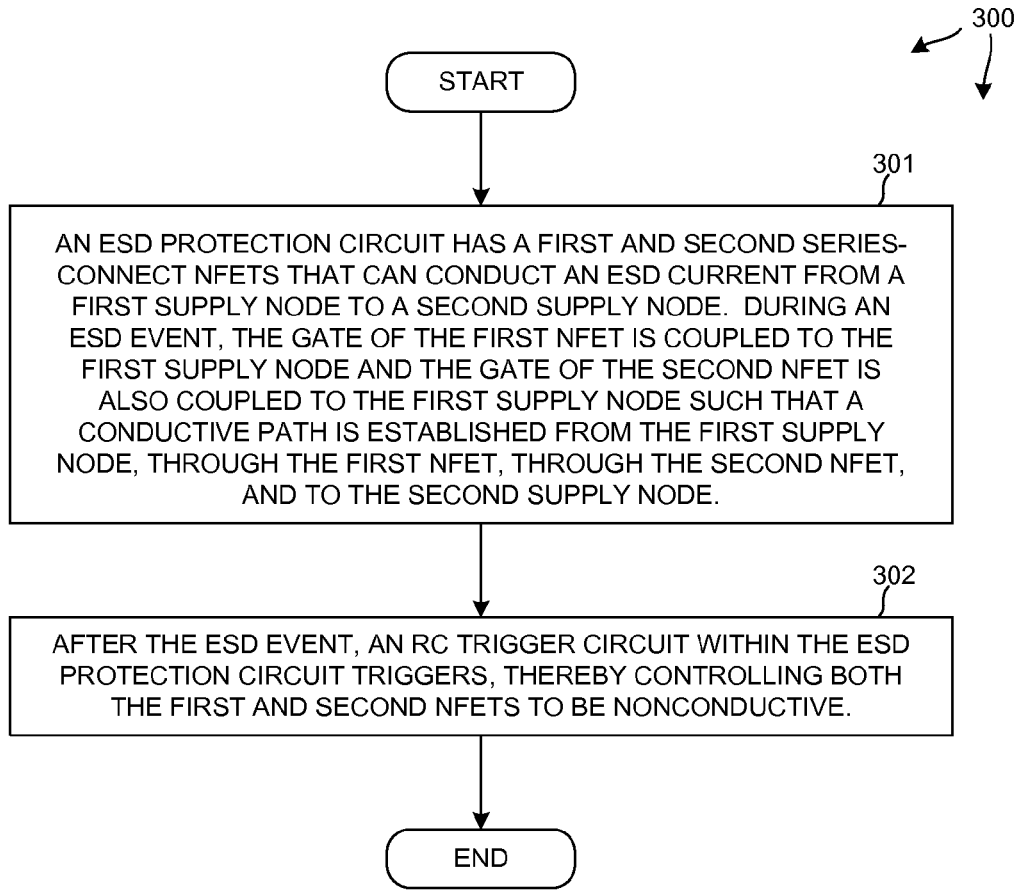
FIG. 8 is a simplified flowchart of a method 300 in accordance with one novel aspect.

FIG. 8 is a simplified flowchart of a method 300 in accordance with one novel aspect. In a first step (step 301), during an ESD event, the gates of the first and second NFETs 115 and 116 are coupled to first supply node 112. In the circuit of FIG. 3, the gate 138 of the first NFET 115 is coupled to first supply node 112 by the P-channel pullup transistor in inverter 120. The gate 139 of the second NFET 116 is coupled to first supply node 112 by conductive P-channel transistors 130 and 131. The RC trigger circuit then times out, such that after the ESD event (step 302) the ESD detection circuit 117 controls both the first and second NFETs 115 and 116 to be nonconductive.

Although certain specific embodiments are described above for instructional purposes, the teachings of this patent document have general applicability and are not limited to the specific embodiments described above. Although not illustrated in FIG. 3, there may be resistor structures between the terminals 107-109 and the associated supply nodes 112-114. Although integrated circuit 104 is illustrated connected into a system, ESD protection circuit 110 also functions to protect integrated circuit 104 in situation in which integrated circuit 104 is a loose packaged integrated circuit that is being handled prior to being incorporated into another circuit or product. Although ESD protection circuit 110 is illustrated in connection with a system in which supply voltage V2 is supplied onto integrated circuit 104 from an external supply, in other embodiments supply voltage V2 is generated on integrated circuit 104. The second supply voltage V2 is believed to have no standard name in the art, but may be referred to as Vcas, for cascode voltage, or may be referred to as Vint, for intermediate voltage, or may be referred to as Vmid, for middle voltage. The values and waveforms set forth above are illustrative. For more accurate numbers and waveforms and for information on additional operational details, the ESD protection circuit can be fabricated and tested. Alternatively, and in addition, the ESD protection circuit can be simulated on a circuit simulator such as SPICE and the nodal voltages and currents can be plotted and analyzed. Accordingly, various modifications, adaptations, and combinations of the various features of the described specific embodiments can be practiced without departing from the scope of the claims that are set forth below.

What is claimed is:

1. An electrostatic discharge (ESD) protection circuit, comprising:
 a first supply node;
 a second supply node;
 a first N-channel field effect transistor (NFET) having a gate;
 a second NFET having a gate, wherein the second NFET is coupled in series with the first NFET such that during an electrostatic discharge (ESD) event an ESD current flows from the first supply node, through the first NFET, through the second NFET, and to the second supply node; and
 an ESD detection circuit that during the ESD event couples the gates of first and second NFETs to the first supply node, wherein the ESD detection circuit comprises:
  an RC circuit that is coupled to the first supply node and to a third supply node such that during the ESD event the RC circuit conducts current from the first supply node and to a trigger node, and from the trigger node and to the third supply node;
  an inverter having an input lead that is coupled to the trigger node, wherein the inverter has a first supply voltage lead and a second supply voltage lead, the first supply voltage lead of the inverter being coupled to the first supply node, the second supply voltage lead of the inverter being coupled to the third supply node, wherein the third supply node is not directly connected to the gate of the second NFET; and
  a P-channel field effect transistor (PFET) having a gate, a source, and a drain, wherein the source is coupled to the trigger node, wherein the drain is coupled to the third supply node, and wherein the gate is coupled to the gate of the second NFET.

2. The ESD protection circuit of claim 1, wherein the ESD detection circuit further comprises:
 a P-channel field effect transistor (PFET) having a gate, a source and a drain, wherein the gate is coupled to the third supply node, and wherein the drain is coupled to the gate of the second NFET.

3. The ESD protection circuit of claim 2, wherein the ESD detection circuit further comprises:
 a resistor having a first lead that is coupled to the drain of the PFET and having a second lead that is coupled to the second supply node.

4. The ESD protection circuit of claim 1, wherein the ESD protection circuit is part of an integrated circuit, wherein the first supply node is coupled to receive a supply voltage from a first terminal of the integrated circuit, and wherein the second supply node is coupled to receive a ground potential from a second terminal of the integrated circuit.

5. The ESD protection circuit of claim 4, wherein the third supply node is coupled to receive a second supply voltage from a third terminal of the integrated circuit.

6. The ESD protection circuit of claim 1, wherein the ESD protection circuit is part of an integrated circuit, and wherein the third supply node is coupled to an output driver of the integrated circuit.

7. The ESD protection circuit of claim 1, wherein the ESD detection circuit further comprises:
 a third NFET having a gate, a source and a drain, wherein the source of the third NFET is coupled to the second supply node, wherein the drain of the third NFET is coupled to the third supply node, and wherein the gate of the third NFET is coupled to the gate of the second NFET.

8. The ESD protection circuit of claim 1, further comprising:
 a third NFET having a gate, a source and a drain, wherein the source of the third NFET is coupled to the third supply node, wherein the drain of the third NFET is coupled to the trigger node, and wherein the gate of the third NFET is coupled to an output lead of the inverter.

9. The ESD protection circuit of claim 1, wherein the first and second NFETs are completely encircled by a substrate tie ring.

10. The ESD protection circuit of claim 1, wherein the ESD event is taken from the group consisting of: a Human Body Model (HBM) event, a Charge Device Model (CDM) event, and a Machine Model (MM) event.

11. A method comprising:
 (a) during an electrostatic discharge (ESD) event, coupling a gate of a first N-channel field effect transistor (NFET) to a first supply node and also coupling a gate of a second NFET to the first supply node such that a conductive path is established from the first supply node, through the first NFET, through the second NFET, and to a second supply node; and
 (b) after the ESD event, controlling both the first and second NFETs to be nonconductive such that the conductive path is broken;
 using an RC circuit to control when the conductive path is broken, wherein the RC circuit involves a capacitance that is charged through a resistance; and changing the resistance as a function of a voltage on the gate of the second NFET.

12. The method of claim 11, wherein the first and second NFETs remain substantially nonconductive if a voltage between the first and second supply nodes increases from zero volts to a supply voltage in twenty microseconds or more.

13. The method of claim 12, further comprising:
receiving a voltage onto a third supply node; and
using a third NFET to couple the third supply node to the second supply node during the ESD event.

14. The method of claim 12, further comprising:
using a level-shifting inverter to drive the gate of the second NFET, wherein the level-shifting inverter has a first input lead and a second input lead, wherein the first input lead is coupled to receive a timing signal, and wherein the second input lead is coupled to a third supply node, and wherein the level-shifting inverter includes a resistor having a first lead and a second lead, the first lead of the resistor being coupled to the gate of the second NFET, the second lead being coupled to the second supply node.

15. The method of claim 11, wherein the second NFET is completely encircled by a substrate tie ring, wherein the substrate tie ring couples a body of the second NFET to a ground potential.

16. An integrated circuit comprising:
a first supply node;
a second supply node;
a first N-channel field effect transistor (NFET) having a gate;
a second NFET having a gate;
a third supply node; and
means for coupling the gates of the first and second NFETs to the first supply node during an ESD event such that an ESD current is conducted from the first supply node, serially through the first and second NFETs, and to the second supply node,
wherein the means for coupling the gates of the first and second NFETs to the first supply node during an ESD event comprises:
means for controlling the first and second NFETs to be substantially nonconductive if a voltage between the first and second supply nodes increases from zero volts to a supply voltage in more than twenty microseconds when there is no ESD event; and
means for coupling the gate of the second NFET to the first supply node when both: 1) a voltage on the third supply node is substantially equal to a voltage on the second supply node, and 2) after an RC circuit of the means has timed out,
wherein the RC circuit includes a capacitance that is charged through a resistance, and
wherein the means for coupling the gates of the first and second NFETs to the first supply node during an ESD event comprises means for changing the resistance as a function of a voltage on the gate of the second NFET.

* * * * *